United States Patent
Zin et al.

(10) Patent No.: US 7,637,269 B1
(45) Date of Patent: Dec. 29, 2009

(54) LOW DAMAGE METHOD FOR ASHING A SUBSTRATE USING $CO_2/CO$-BASED PROCESS

(75) Inventors: Kelvin Zin, Albany, NY (US); Masaru Nishino, Tokyo (JP); Chong Hwan Chu, Guilderland, NY (US); Yannick Feurprier, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/511,832

(22) Filed: Jul. 29, 2009

(51) Int. Cl.
*B08B 6/00* (2006.01)

(52) U.S. Cl. .............. 134/1.2; 134/1; 134/1.1; 134/1.3; 134/2; 134/31; 134/34; 134/35; 134/36; 134/42; 134/902; 216/67; 438/706; 438/710; 438/711; 438/725

(58) Field of Classification Search .......... 134/1, 134/1.1, 1.2, 1.3, 2, 31, 34, 35, 36, 42, 902; 216/67; 438/706, 710, 711, 725
See application file for complete search history.

(56) References Cited

U.S. PATENT DOCUMENTS

| 7,279,427 | B2 | 10/2007 | Nishino et al. | |
| 7,288,484 | B1 | 10/2007 | Goto et al. | |
| 7,396,769 | B2 | 7/2008 | Hudson et al. | |
| 2004/0168705 | A1 | 9/2004 | Sun et al. | |
| 2005/0118541 | A1 | 6/2005 | Ahn et al. | |
| 2005/0194354 | A1 | 9/2005 | Onishi et al. | |
| 2006/0199370 | A1 | 9/2006 | Dai et al. | |
| 2007/0032087 | A1* | 2/2007 | Nishino et al. | 438/706 |
| 2007/0059933 | A1 | 3/2007 | Tahara et al. | |
| 2007/0249172 | A1* | 10/2007 | Huang et al. | 438/711 |
| 2008/0044995 | A1 | 2/2008 | Kang et al. | |
| 2008/0135517 | A1 | 6/2008 | Balasubramaniam | |
| 2008/0248656 | A1 | 10/2008 | Chen et al. | |

* cited by examiner

*Primary Examiner*—Sharidan Carrillo

(57) ABSTRACT

A method for removing a mask layer and reducing damage to a patterned dielectric layer is described. The method comprises disposing a substrate in a plasma processing system, wherein the substrate has a dielectric layer formed thereon and a mask layer overlying the dielectric layer. A pattern is formed in the mask layer and a feature formed in the dielectric layer corresponding to the pattern as a result of an etching process used to transfer the pattern in the mask layer to the dielectric layer. The feature includes a sidewall with a first roughness resulting from the etching process. A process gas comprising $CO_2$ and CO is introduced into the plasma processing system, and plasma is formed. The mask layer is removed, and a second roughness, less than the first roughness, is produced by selecting a flow rate of the CO relative to a flow rate of the $CO_2$.

19 Claims, 12 Drawing Sheets

LOW DAMAGE METHOD FOR ASHING A SUBSTRATE USING $CO_2$/CO-BASED PROCESS

CROSS-REFERENCE TO RELATED APPLICATIONS

This application is related to pending U.S. patent application Ser. No. 11/608,872, entitled "METHOD AND APPARATUS FOR ASHING A SUBSTRATE USING CARBON DIOXIDE" (ES-107), filed on Dec. 11, 2006. The entire content of this application is herein incorporated by reference in its entirety.

BACKGROUND OF THE INVENTION

1. Field of Invention

The invention relates to a method and apparatus for removing residue from a substrate.

2. Description of Related Art

Typically, during fabrication of integrated circuits (ICs), semiconductor production equipment utilize a (dry) plasma etch process to remove or etch material along fine lines or within vias or contacts patterned on a semiconductor substrate. The success of the plasma etch process requires that the etch chemistry includes chemical reactants suitable for selectively etching one material while substantially not etching another material. For example, on a semiconductor substrate, a pattern formed in a mask layer can be transferred to an underlying layer of a selected material utilizing a plasma etching process. The mask layer may comprise a radiation-sensitive layer, such as a photo-resist layer, having a pattern formed therein using a lithographic process. Once the pattern is transferred from the patterned mask layer to the underlying layer, using, for example, dry plasma etching, the remaining mask layer, as well as post-etch residues, are removed via an ashing (or stripping) process. For instance, in conventional ashing processes, the substrate having the remaining mask layer is exposed to an oxygen plasma formed from the introduction of diatomic oxygen ($O_2$) and ionization/dissociation thereof. However, the ability to remove residual protective mask layers while maintaining pattern integrity (e.g., CD, roughness, etc.) and minimizing damage to the underlying layer is critical.

Furthermore, during pattern transfer, undulations or variations in the edge profile of the pattern in the mask layer as well as variations in pattern dimension, can be propagated into the underlying layers. These undulations or variations may be observed as edge roughness or line edge roughness (LER) in some instances, or as pitting in other instances. Edge roughness may arise due to damage to the layer of radiation-sensitive material. During the application of the radiation-sensitive material, the post-application bake (PAB), the exposure step, the post-exposure bake (PEB), or the wet developing step, or any combination thereof, the radiation-sensitive material may be damaged. Moreover, damage may occur during the initial phases of the ARC layer etch, hard mask etch, or thin film etch. Pitting may arise when performing pattern transfer in a porous material, such as porous low dielectric constant (low-k) materials or porous ultra-low-k materials.

SUMMARY OF THE INVENTION

The invention relates to a method and apparatus for removing residue from a substrate.

The invention also relates to a method for removing a mask layer and reducing damage to a patterned dielectric layer.

According to one embodiment, a method for removing residue from a substrate is described. The method comprises disposing a substrate in a plasma processing system, wherein the substrate has a dielectric layer formed thereon and a mask layer overlying the dielectric layer. A pattern is formed in the mask layer and a feature formed in the dielectric layer corresponding to the pattern as a result of an etching process used to transfer the pattern in the mask layer to the dielectric layer. The feature includes a sidewall with a first roughness resulting from the etching process. A process gas comprising $CO_2$ and CO is introduced into the plasma processing system, and plasma is formed. The mask layer is removed, and a second roughness, less than the first roughness, is produced by selecting a flow rate of the CO relative to a flow rate of the $CO_2$.

DETAILED DESCRIPTION OF SEVERAL EMBODIMENTS

Figure 1A:
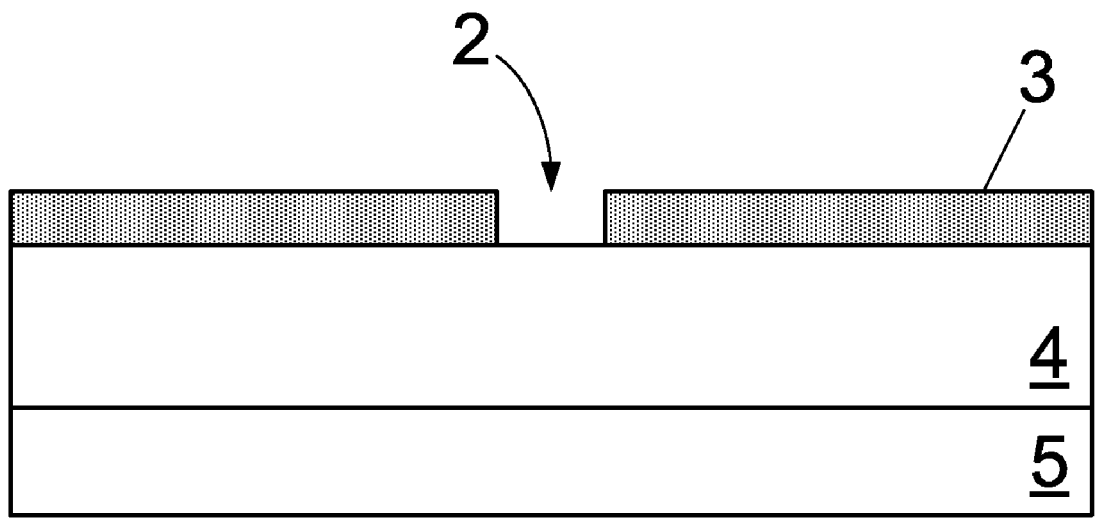
FIGS. 1A through 1C illustrate a schematic representation of a procedure for etching a feature pattern in a substrate according to an embodiment.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

During pattern transfer, as described above, undulations or variations in the edge profile of the pattern as well as variations in pattern dimension, can be propagated in to the underlying layers. These undulations may be observed as feature roughness, e.g., line edge roughness (LER) or pitting. Conventional process chemistries fail to reduce feature roughness and, to the contrary, often worsen feature roughness in the underlying layer.

Figure 1B:
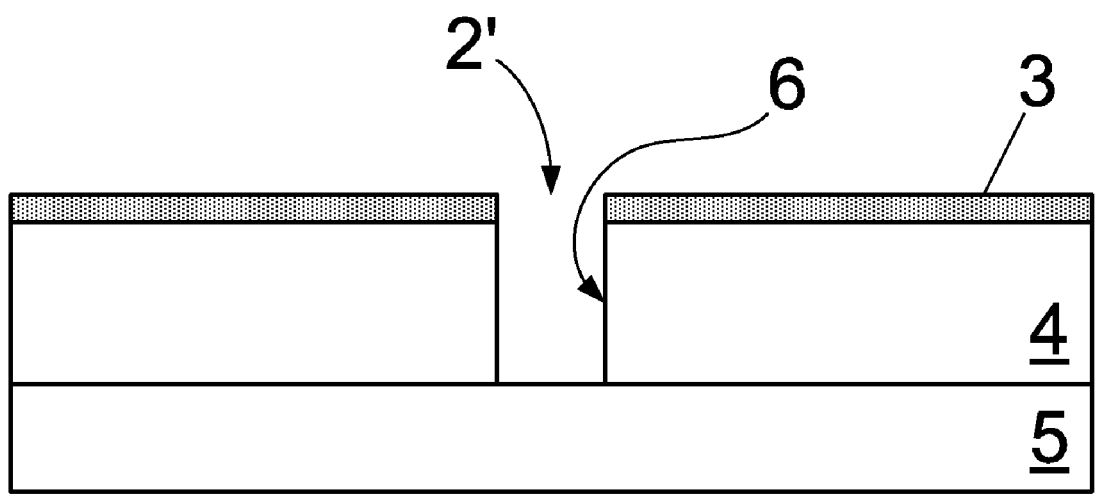
Figure 1C:
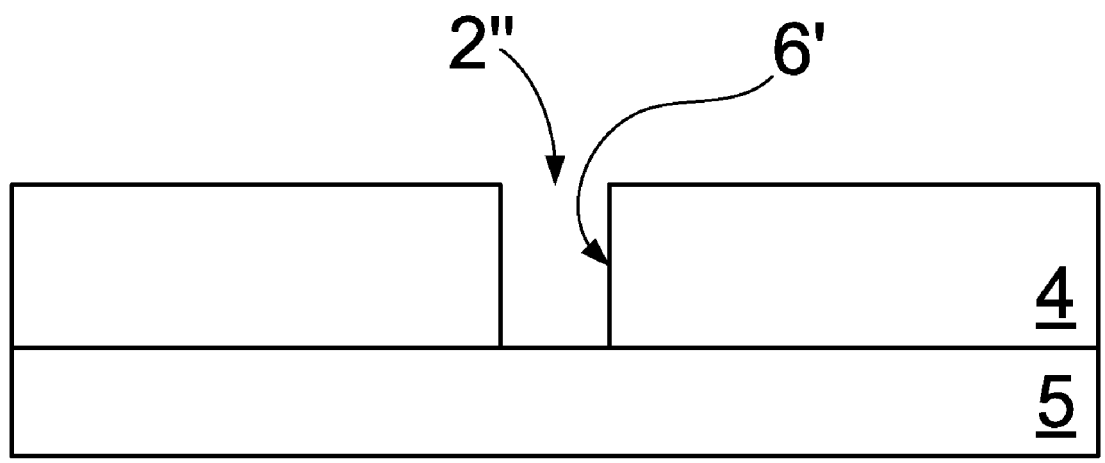

Therefore, a method for patterning a dielectric layer on a substrate is described according to an embodiment. As illustrated in FIGS. 1A through 1C, a mask layer 3 having a pattern 2 formed therein (see FIG. 1A) may be utilized for preparing a feature 2' (see FIG. 1B) within a dielectric layer 4 on substrate 5 that corresponds to pattern 2. The mask layer 3 may comprise a layer of radiation-sensitive material, such as photoresist. Moreover, the mask layer 3 may comprise multiple layers including, but not limited to, a soft mask layer, a hard mask layer, an anti-reflective coating (ARC) layer, a planarization layer, etc. In one example, the mask layer 3 may include a layer of photoresist overlying an ARC layer and an organic planarization layer (OPL). In another example, one or more hard mask layers are disposed between mask layer 3 and dielectric layer 4.

The pattern 2 may comprise various pattern geometries, including nested pattern geometries (e.g., closely spaced pattern geometries) or isolated pattern geometries (e.g., widely spaced pattern geometries), narrow pattern geometries (e.g., relatively narrow critical dimension (CD)), or wide pattern geometries (e.g., relatively wide critical dimension (CD)), or any combination of two or more thereof. Patterning of the mask layer 3 may include one or more lithographic steps, followed by one or more dry development steps (i.e., dry etching steps). For example, during lithography, a layer of radiation-sensitive material is exposed to a geometric pattern of electromagnetic (EM) radiation using a micro-lithography system. The irradiated regions of the radiation-sensitive material are removed (as in the case of positive photo-resist), or non-irradiated regions are removed (as in the case of negative resist) using a (wet) developing process. Thereafter, the resulting pattern in the layer of radiation-sensitive material may be transferred to the underlying sub-layers of mask layer 3 using one or more dry etching processes (see FIG. 1A).

As illustrated in FIG. 1B, the pattern 2 is transferred to the dielectric layer 4 using one or more etching processes to form feature 2' having sidewall 6. Feature 2' may, for example, include an interconnect line or trench, a capacitor trench, a via, a contact, etc.

As illustrated in FIG. 1C, the mask layer 3 or the remaining portion of mask layer 3, as well as other post-etch residue, are removed via an ashing process leaving feature 2" with sidewall 6'. As noted above, the mask layer 3 is conventionally removed by exposing the mask layer 3 to plasma formed from a gas containing $O_2$. The present inventors have recognized; however, that such a method can damage dielectric layer 4 and, in particular, low-k (low dielectric constant) dielectric films and porous low-k dielectric films. Such damage may be damage that affects the critical dimension (CD) of the feature etched in the dielectric layer 4 (e.g., pitting, bowing, etc.), or damage that increases the dielectric constant of the dielectric. For instance, this damage may be observed in sidewall 6'. In addition and as will be described in detail below, the inventors recognized that forming plasma using a process gas combining CO with $CO_2$ and selecting an appropriate amount of each process gas constituent can reduce and/or minimize damage to such films, and improve profile control including, but not limited to, the following: (1) reduction of sidewall damage; (2) reduction of pitting; (3) reduction of profile bowing (or undercut); (4) improved profile control; and (5) improved CD reduction (or CD bias) control.

Figure 2:
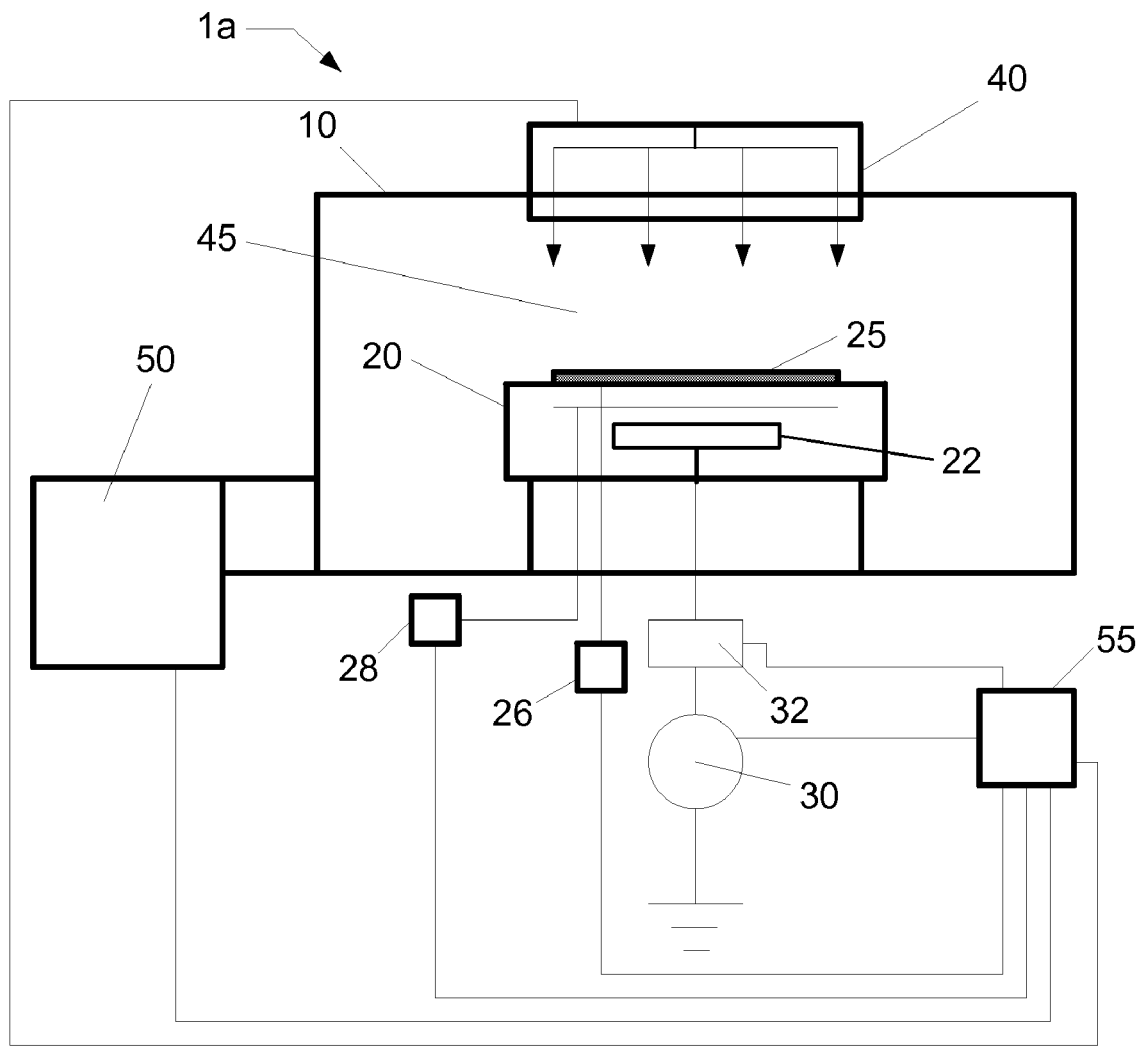
FIG. 2 shows a schematic representation of a processing system according to an embodiment.

According to one embodiment, a processing system 1a configured to perform the above identified process conditions is depicted in FIG. 2 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a predetermined materials process, and/ or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermo-electric heaters/coolers can be included in the substrate holder 20, as well as the chamber wall of the plasma processing chamber 10 and any other component within the processing system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 2, substrate holder 20 can comprise an electrode 22 through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pumping system 50, as well as the substrate heating/cooling system (not shown), the backside gas delivery system 26, and/or the electrostatic clamping system 28. For example, a program stored in the memory can be utilized to activate the inputs to the aforementioned components of plasma processing system 1a according to a process recipe in order to perform a plasma assisted process on substrate 25.

Controller 55 can be locally located relative to the processing system 1a, or it can be remotely located relative to the processing system 1a. For example, controller 55 can exchange data with processing system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 3, processing system 1b can be similar to the embodiment of FIG. 2 and further comprise either a stationary, or mechanically or electrically rotating magnetic field system 60, in order to potentially increase plasma density and/or improve plasma processing uniformity, in addition to those components described with reference to FIG. 2. Moreover, controller 55 can be coupled to magnetic field system 60 in order to regulate the speed of rotation and field strength. The design and implementation of a rotating magnetic field is well known to those skilled in the art.

Figure 3:
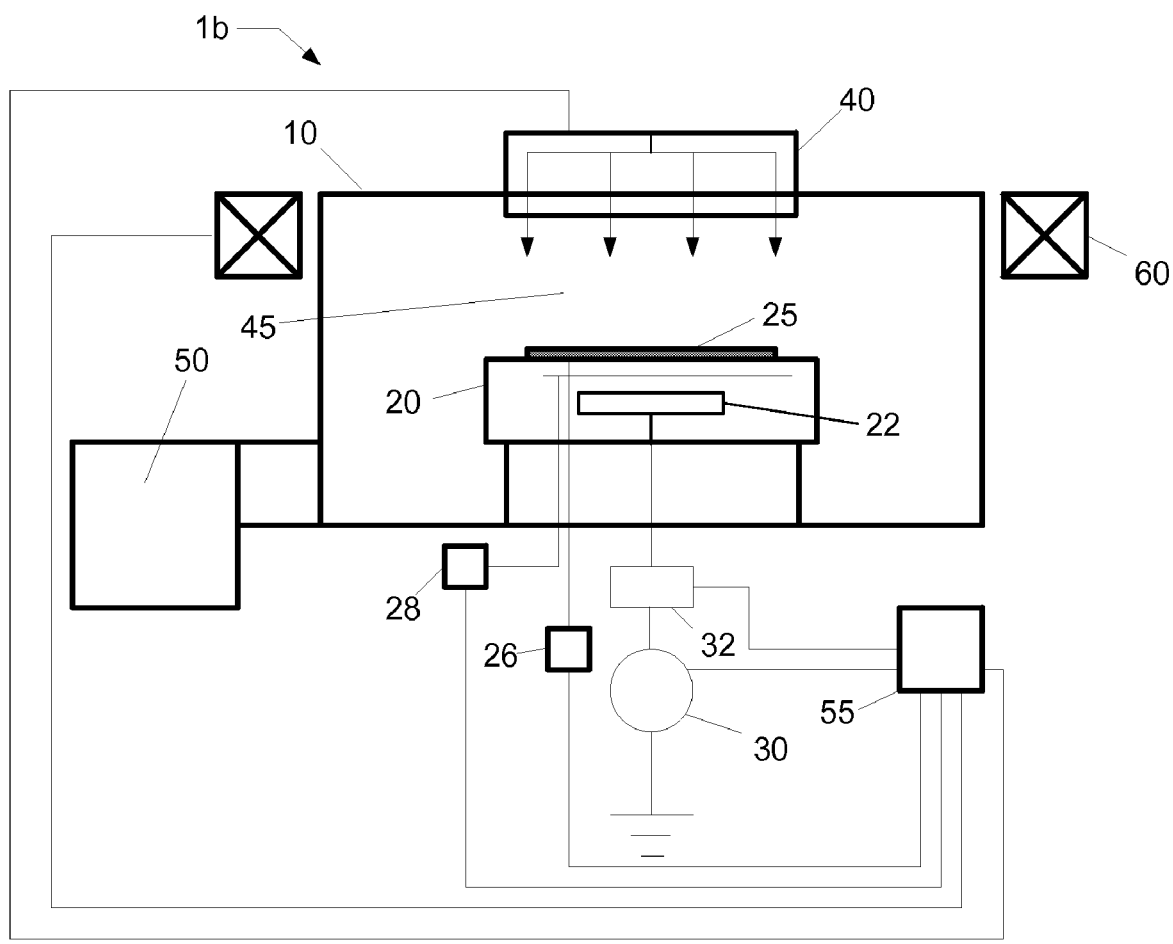
FIG. 3 shows a schematic representation of a processing system according to another embodiment.
Figure 4:
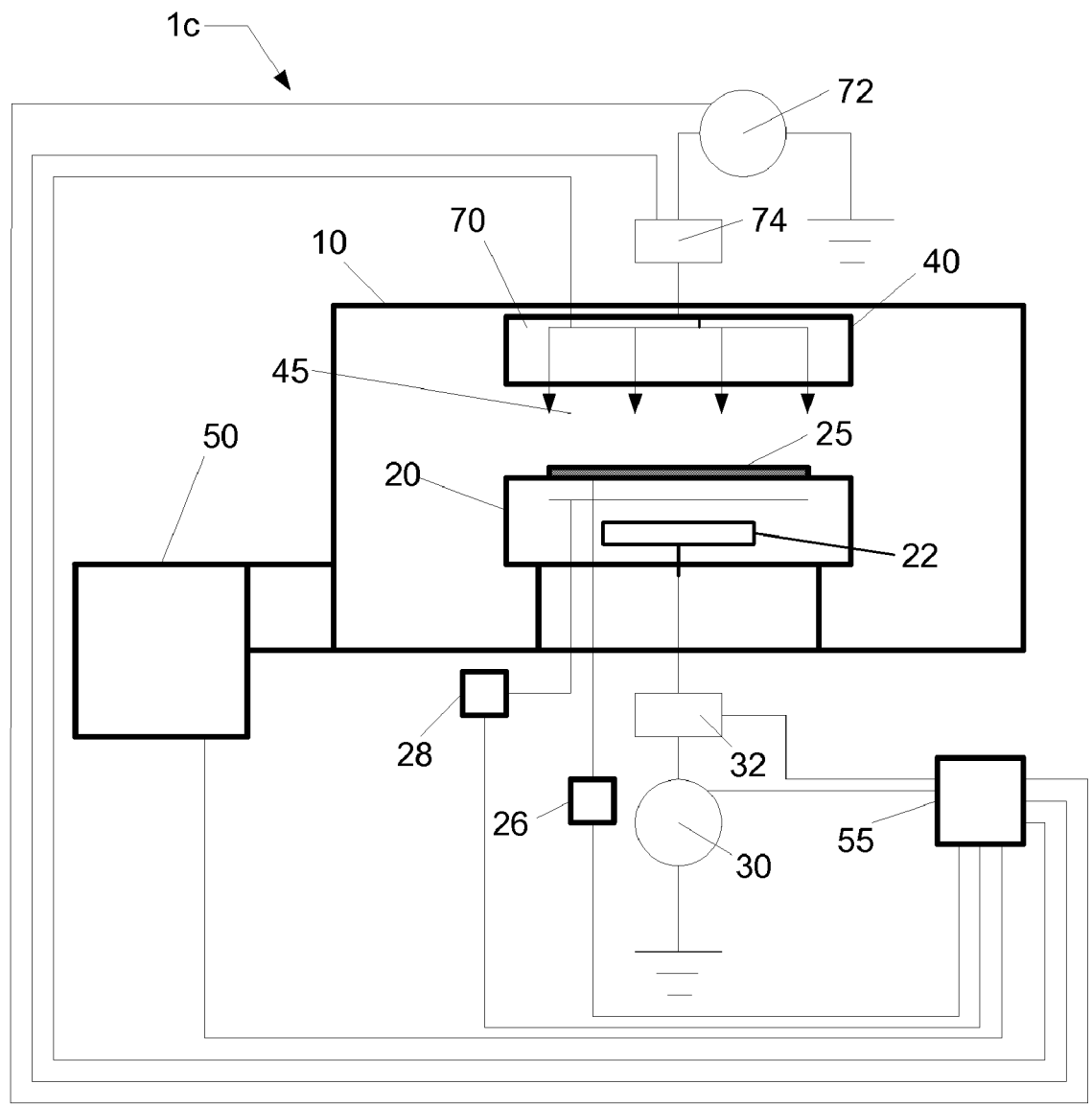
FIG. 4 shows a schematic representation of a processing system according to another embodiment.

In the embodiment shown in FIG. 4, processing system 1c can be similar to the embodiment of FIG. 2 or FIG. 3, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 5:
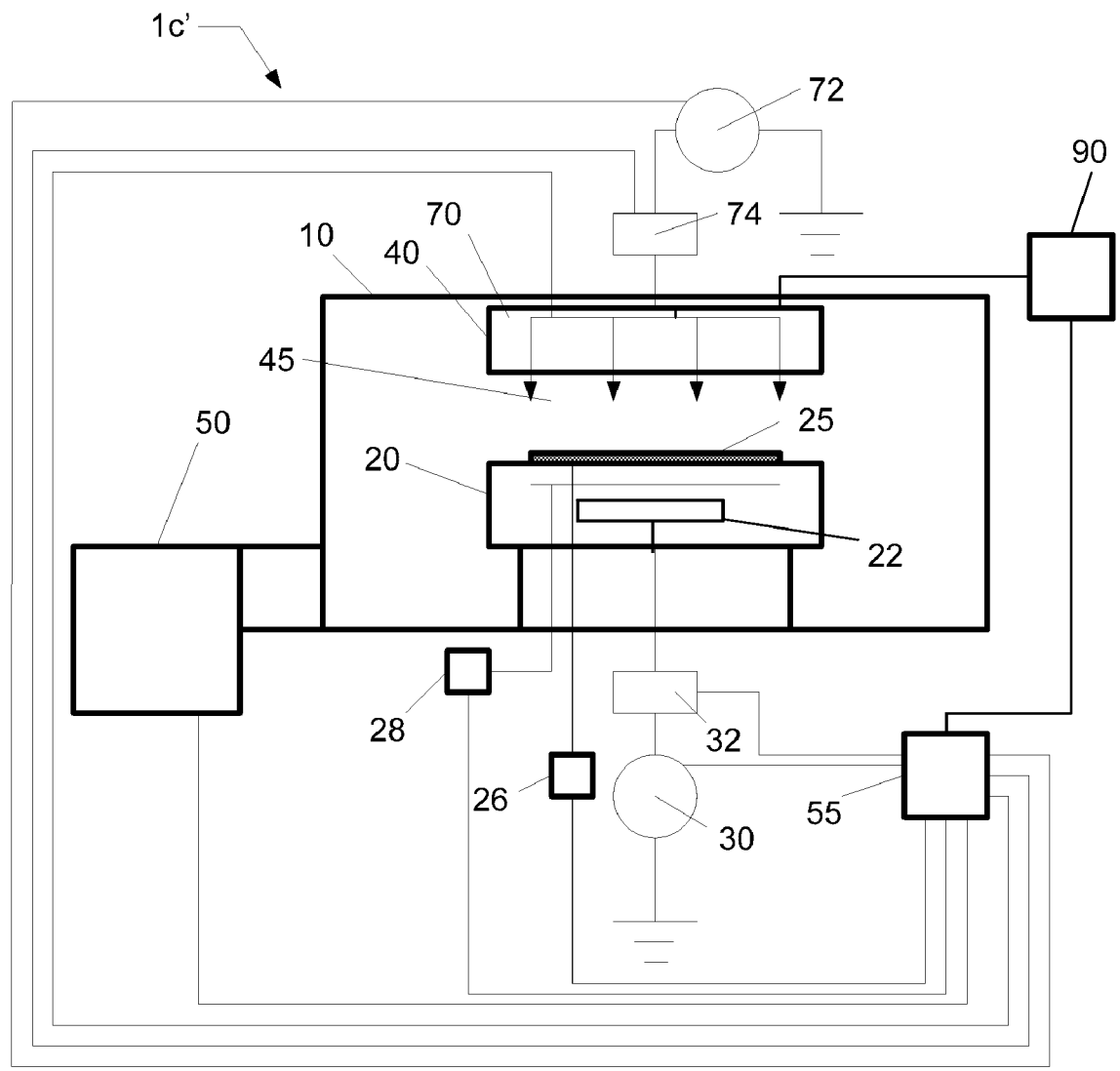
FIG. 5 shows a schematic representation of a processing system according to another embodiment.

In the embodiment shown in FIG. 5, processing system 1c' can be similar to the embodiment of FIG. 4, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring, adjusting, or controlling the polarity, current, voltage, or on/off state of the DC power supply 90. Once plasma is formed, the DC power supply 90 facilitates the formation of a ballistic electron beam. An electrical filter (not shown) may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 6:
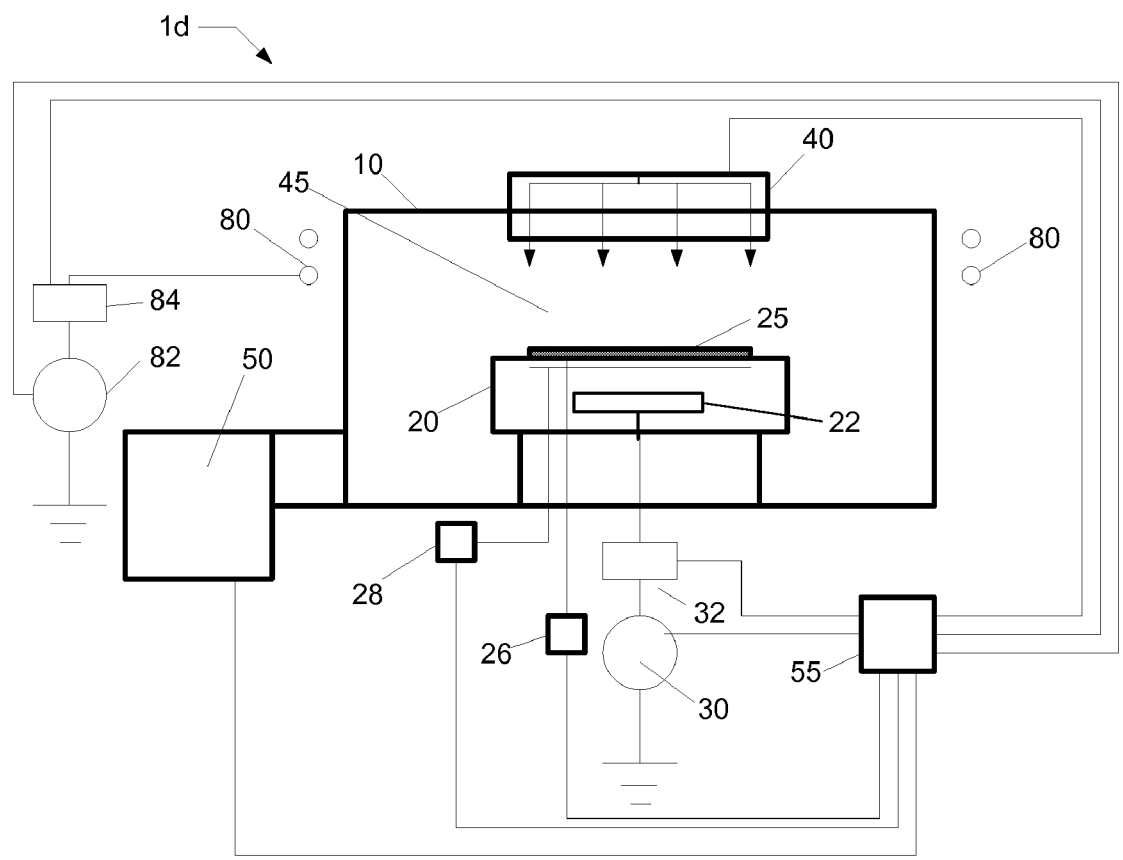
FIG. 6 shows a schematic representation of a processing system according to another embodiment.

In the embodiment shown in FIG. 6, the processing system 1d can be similar to the embodiments of FIGS. 2 and 3, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 7:
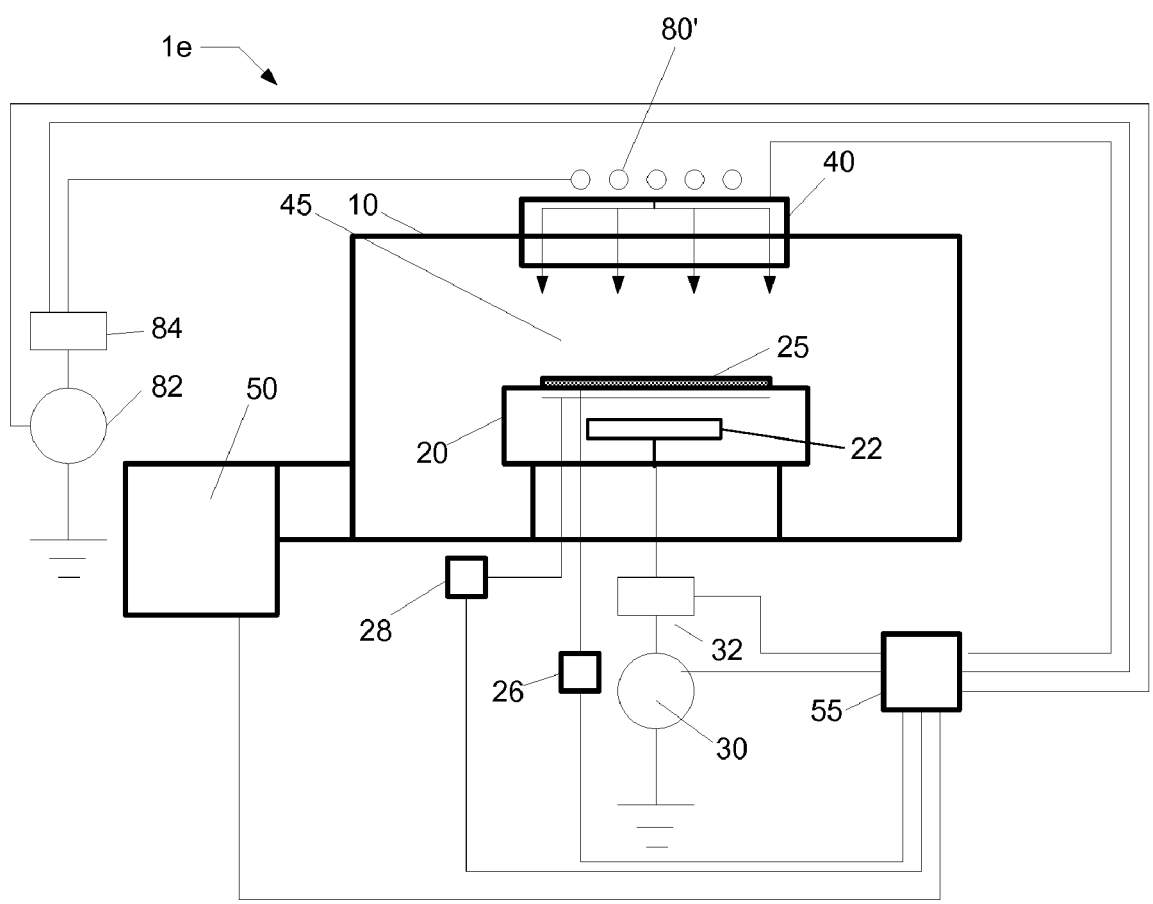
FIG. 7 shows a schematic representation of a processing system according to another embodiment.

In an alternate embodiment, as shown in FIG. 7, the processing system 1e can be similar to the embodiment of FIG. 6, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 8:
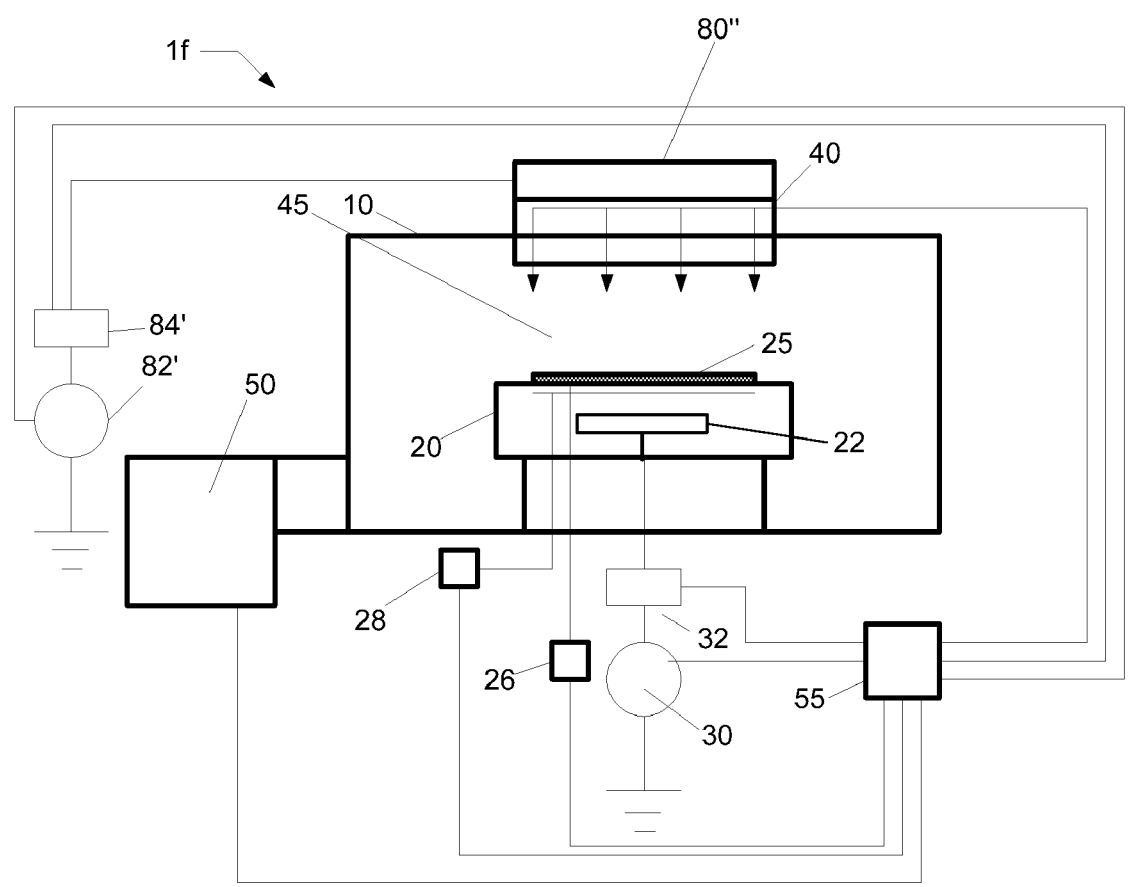
FIG. 8 shows a schematic representation of a processing system according to another embodiment.

In the embodiment shown in FIG. 8, the processing system 1f can be similar to the embodiment of FIG. 2, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

In the following discussion, a method of patterning a dielectric layer to form a feature therein on a substrate is presented. For example, the processing system for performing dry plasma etching and ashing can comprise various elements, such as described in FIGS. 2 through 8, and combinations thereof.

Figure 9:
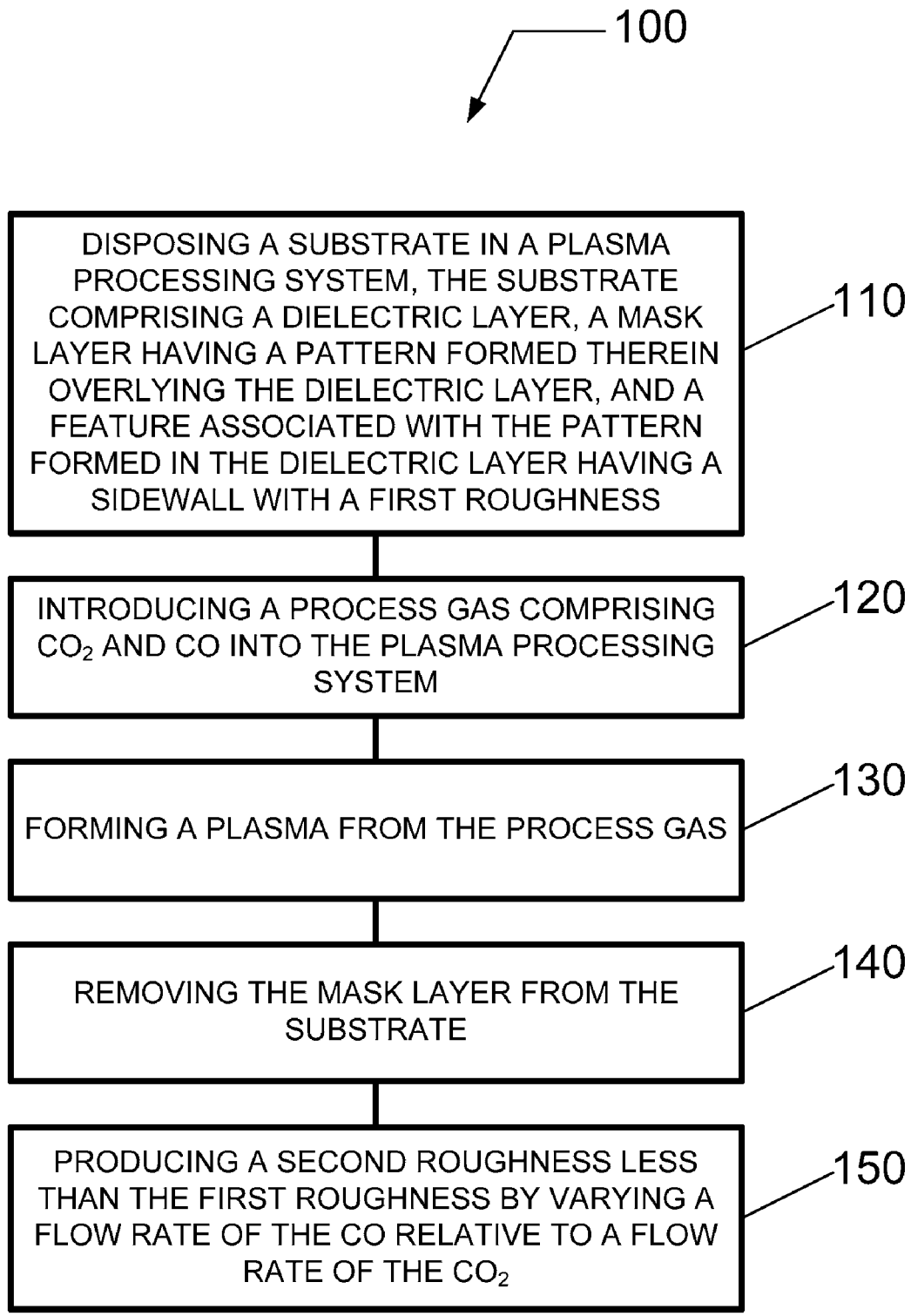
FIG. 9 provides a flow chart illustrating a method of etching a feature in a substrate according to an embodiment.

Turning now to FIG. 9, a method for removing residue from a substrate is described. The method includes a flow chart 100 beginning in 110 with disposing a substrate in a plasma processing system, wherein the substrate has a thin film, such as a dielectric layer, formed thereon and a mask layer overlying the thin film. The mask layer may include a single layer or multiple layers. For example, the mask layer may comprise a lithographic layer, including a layer of radiation-sensitive material such as photoresist, an anti-reflective coating (ARC) layer, a soft mask layer, a hard mask layer, or a planarization layer, or any combination of two or more thereof. Other layers and/or structures may be disposed between the thin film and the underlying substrate, or between the thin film and the overlying mask layer. The substrate may comprise a semiconductor substrate, a wafer, a flat panel display, or a liquid crystal display.

The thin film may comprise a conductive layer, a non-conductive layer, or a semi-conductive layer. For instance, the thin film may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, or silicon oxynitride, etc. Additionally, for instance, the thin film may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film may have a dielectric constant of less than 3.7, or a dielectric constant ranging from 1.6 to 3.7.

These dielectric layers may include at least one of an organic, inorganic, or inorganic-organic hybrid material. Additionally, these dielectric layers may be porous or non-porous.

For example, these dielectric layers may include an inorganic, silicate-based material, such as carbon doped silicon oxide (or organo siloxane), deposited using CVD techniques. Examples of such films include Black Diamond® CVD organosilicate glass (OSG) films commercially available from Applied Materials, Inc., or Coral® CVD films commercially available from Novellus Systems, Inc.

Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

Still alternatively, these dielectric layers may include an inorganic, silicate-based material, such as hydrogen silsesquioxane (HSQ) or methyl silsesquioxane (MSQ), deposited using SOD (spin-on dielectric) techniques. Examples of such films include FOx® HSQ commercially available from Dow Corning, XLK porous HSQ commercially available from Dow Corning, and JSR LKD-5109 commercially available from JSR Microelectronics.

Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3P™ semiconductor dielectric resins commercially available from Honeywell.

The thin film can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL) (Tokyo, Japan). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

As described above, the one or more mask layers may comprise a lithographic layer. The lithographic layer may comprise a layer of radiation-sensitive material, such as photo-resist. The photo-resist layer may comprise 248 nm (nanometer) resists, 193 nm resists, 157 nm resists, EUV (extreme ultraviolet) resists, or electron beam sensitive resist. The photo-resist layer can be formed using a track system. For example, the track system can comprise a Clean Track ACT 8, ACT 12, or Lithius resist coating and developing system commercially available from Tokyo Electron Limited (TEL). Other systems and methods for forming a photo-resist layer on a substrate are well known to those skilled in the art of spin-on resist technology.

A pattern is formed in the mask layer and a feature formed in the dielectric layer corresponding to the pattern as a result of an etching process used to transfer the pattern in the mask layer to the dielectric layer. The feature pattern may be formed using photo-lithography, electron beam lithography, imprint lithography, wet etching, or dry etching, or any combination of two or more thereof.

In photo-lithography, a lithographic layer is imaged with an image pattern. Therein, the lithographic layer is exposed to EM radiation through a reticle in a dry or wet photo-lithography system. The image pattern can be formed using any suitable conventional stepping lithographic system, or scanning lithographic system. The photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Although photo-lithography is described above, other techniques may be used to form the image pattern in the lithographic layer. Other techniques may include direct-write or non-direct write techniques including electron beam patterning systems. Thereafter, the image pattern is developed in the lithographic layer to form the feature pattern having a first critical dimension (CD). The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

Thereafter, the pattern formed in the mask layer is transferred to the underlying thin film using one or more etching processes. The one or more etching process may include one or more dry processes and/or one or more wet processes. For example, the one or more etching processes may include one or more dry plasma etching processes.

The feature pattern may comprise narrow lines and/or vias, wide lines and/or vias, nested features, isolated features, etc. The feature includes a sidewall with a first roughness resulting from the etching process. For example, the first roughness may be attributed to, among other things, the formation of the pattern in the mask layer, wherein roughness is propagated to the underlying thin film during etching, and/or damage arising from the etching process itself.

The first roughness may be characterized by an arithmetic average of the roughness about a mean surface profile of the feature, a root-mean-squared deviation of the roughness about a mean surface profile of the feature, a maximum valley depth of the roughness about a mean surface profile of the feature, a maximum peak height of the roughness about a mean surface profile of the feature, or a maximum height (or range between minimum height and maximum height) of the roughness profile, or any combination of two or more thereof.

In 120, a process gas comprising $CO_2$ and CO is introduced into the plasma processing system and, in 130, plasma is formed. The process gas may further comprise a hydrocarbon gas ($C_xH_y$), wherein x and y are integers greater than or equal to unity. Additionally, the process gas may further comprise a hydrocarbon gas, a hydrofluorocarbon gas, a fluorocarbon gas, $N_2$, $H_2$, $O_2$, NO, $NO_2$, or $N_2O$, or a combination of two or more thereof. Additionally yet, the process gas may further comprise an inert gas, such as a noble gas. For example, the method of removing residue may further comprise introducing an additive gas into the plasma processing system, and terminating the introduction of the additive gas prior to terminating the introduction of the process gas. The additive gas may contain one or more gases selected from the group consisting of $N_2$, $H_2$, $O_2$, NO, $NO_2$, $N_2O$, a hydrocarbon gas, a hydrofluorocarbon gas, a fluorocarbon gas, and an inert gas.

In 140, the mask layer is removed. In 150, a second roughness, less than the first roughness, is produced by selecting a flow rate of the CO relative to a flow rate of the $CO_2$. In one embodiment, a ratio of the flow rate of the $CO_2$ to the flow rate of the CO may range from about 1 to about 5. In another embodiment, a ratio of the flow rate of the $CO_2$ to the flow rate of the CO may range from about 1.5 to about 3. In yet another embodiment, a ratio of the flow rate of the $CO_2$ to the flow rate of the CO may range from about 2 to about 3.

The amount of CO relative to the amount of $CO_2$ may be selected to produce a second roughness less than about 5 nm (nanometers). Alternatively, the amount of CO relative to the amount of $CO_2$ may be selected to produce a second roughness less than about 4 nm. Alternatively yet, the amount of CO relative to the amount of $CO_2$ may be selected to produce a second roughness less than about 3 nm.

In one embodiment, the method of removing residue may comprise a process parameter space including: a chamber pressure ranging up to about 1000 mtorr (millitorr) (e.g., up to about 100 mtorr, or up to about 80 mtorr), a $CO_2$ process gas flow rate ranging up to about 2000 sccm (standard cubic centimeters per minute) (e.g., up to about 1000 sccm, or about 200 sccm to about 1000 sccm, or about 500 sccm to about 1000 sccm, or about 750 sccm), a CO process gas flow rate ranging up to about 2000 sccm (e.g., up to about 1000 sccm, or about 100 sccm to about 1000 sccm, or about 200 sccm to about 500 sccm), an upper electrode (e.g., element 70 in FIG. 4) RF bias ranging up to about 2000 W (watts) (e.g., up to about 1000 W, or up to about 500 W), and a lower electrode (e.g., element 20 in FIG. 5) RF bias ranging up to about 1000 W (e.g., up to about 600 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In another alternate embodiment, RF power is supplied to the upper electrode and not the lower electrode. In another alternate embodiment, RF power is supplied to the lower electrode and not the upper electrode.

The time to remove the mask layer or residue or both, and produce the second roughness can be determined using design of experiment (DOE) techniques; however, it can also be determined using endpoint detection. One possible method of endpoint detection is to monitor a portion of the emitted light spectrum from the plasma region that indicates when a change in plasma chemistry occurs due to substantially near completion of the removal of mask layer from the substrate and contact with the underlying thin film. For example, a portion of the spectrum that indicates such changes includes a wavelength of 482.5 nm (CO), and can be measured using optical emission spectroscopy (OES). Other species may include $CO_2$ and/or O radical. After emission levels corresponding to the monitored wavelengths cross a specified threshold (e.g., drop to substantially zero, drop below a particular level, or increase above a particular level), an endpoint can be considered to be complete. Other wavelengths that provide endpoint information can also be used. Furthermore, the etch time can be extended to include a period of over-ash, wherein the over-ash period constitutes a fraction (i.e. 1 to 100%) of the time between initiation of the etch process and the time associated with endpoint detection.

In yet another embodiment, the method of removing residue may further comprise pre-treating the mask layer and feature to form a protective layer on the sidewall prior to the introducing the process gas comprising $CO_2$ and CO into the plasma processing system. The pre-treating may include: introducing a pre-treatment process gas to the plasma processing system; forming a pre-treatment plasma from the pre-treatment process gas in the plasma processing system; and exposing the mask layer and the patterned thin film to the pre-treatment plasma. Alternatively, the pre-treatment plasma is not formed and the mask layer and patterned thin film are only exposed to pre-treatment process gas. The pre-treatment process gas may contain one or more gases selected from the group consisting of a hydrocarbon gas, a hydrofluorocarbon gas, a fluorocarbon gas, $N_2$, $H_2$, $O_2$, NO, $NO_2$, $N_2O$, and an inert gas.

In an example, a method of removing a mask layer and post-etch residue following a dry etching process for transferring a pattern to an underlying dielectric layer is presented. The dielectric layer comprises an ultra-low-dielectric constant (ultra-low-k, or ULK) material. For example, the ULK material includes a porous SiCOH film (e.g., k<2.5) formed using a plasma enhanced chemical vapor deposition (PECVD) process. The dielectric layer may further include an overlying hard mask layer and capping layer.

When patterning the dielectric layer, a mask layer is formed above the dielectric layer, wherein the mask layer may include a photoresist layer, an ARC layer, and an OPL. The photoresist may be patterned using lithography, and the pattern formed therein may be transferred to the ARC layer, the OPL and the dielectric layer using a series of etching processes, as described above.

For instance, a porous SiCOH-containing material, formed using plasma-enhanced chemical vapor deposition (PECVD p-SiCOH), is inserted within a film stack having, from top to bottom, a lithographic layer, a Si-containing ARC layer, a $SiO_x$ hard mask layer, an organic planarization layer (OPL), another $SiO_x$ hard mask layer, a SiCOH hard mask layer, the PECVD p-SiCOH layer, and a multi-layer etch stop layer. The pattern may include a via pattern for forming a via in the porous SiCOH-containing material.

A procedure for transferring a feature pattern through this film stack is as follows: (1) process step 1 transfers a feature pattern in the lithographic layer to the underlying ARC layer and $SiO_x$ hard mask layer; (2) process step 2 transfers the feature pattern in the ARC layer to the underlying OPL; (3) process step 3 transfers the feature pattern in the OPL to the underlying $SiO_x$ hard mask layer; (4) process step 4 provides an oxygen-containing flash process; (5) process steps 5 and 6 transfer the feature pattern in the $SiO_x$ hard mask layer to an underlying PECVD p-SiCOH layer (i.e., main etching process for transferring the feature pattern to the thin film as described above); (6) process step 7 provides a first ashing process; (7) process step 8 provides a liner removal (LRM) process for etching a silicon nitride layer underlying the PECVD p-SiCOH layer; (8) process step 9 provides a defluorination cleaning (DFC) process to remove fluorine (F)-containing material from the substrate and the plasma processing system.

The ashing process may be performed utilizing a plasma processing device such as the one described in FIG. 5. However, the methods discussed are not to be limited in scope by this exemplary presentation.

As noted above, the present inventors discovered that using CO in combination with $CO_2$ in a plasma ashing process can reduce damage to the dielectric compared to both a $CO_2$ ashing process and an $O_2$ ashing process. The inventors have further discovered that varying certain aspects of the ashing process can reduce pitting, reduce bowing, improve existing sidewall roughness, improve sidewall profile control, and improve CD bias control, among other things for features etched in the dielectric.

TABLE 1

| Ash condition | Pressure (mtorr) | UEL Power (W) | LEL Power (W) | CO$_2$ Flow Rate (sccm) | CO Flow Rate (sccm) | Time (sec) |
|---|---|---|---|---|---|---|
| Reference | 50 | 0 | 540 | 750 | 0 | EPD + 50% over-ash |
| 1 | 50 | 0 | 540 | 750 | 250 | EPD + 50% over-ash |
| 2 | 50 | 0 | 540 | 750 | 375 | EPD + 50% over-ash |

Table 1 provides an exemplary process recipe for a conventional $CO_2$ ashing process (i.e., "Reference"), a first $CO_2$/CO ashing process (i.e., "1"), and a second $CO_2$/CO ashing process (i.e., "2"). For each ashing process, a process condition is recited including a pressure (millitorr, mtorr) in the plasma processing chamber, an upper electrode (UEL) power (watts, W), a lower electrode (LEL) power (watts, W), a $CO_2$ flow rate (standard cubic centimeters per minute, sccm), a CO flow rate, and ashing time.

Other process conditions for each of the process recipes listed in Table 1 include: backside helium gas pressures of 15 torr (center) and 40 torr (edge); UEL temperature (e.g., upper electrode 70 in FIG. 6)=60 degrees C.; and chamber wall temperature=60 degrees C.; substrate holder temperature (e.g., substrate holder 20 in FIG. 6)=20 degrees C.; and a center-to-edge for rate distribution of 1:1 (or 50%-center/50%-edge).

Figure 10:
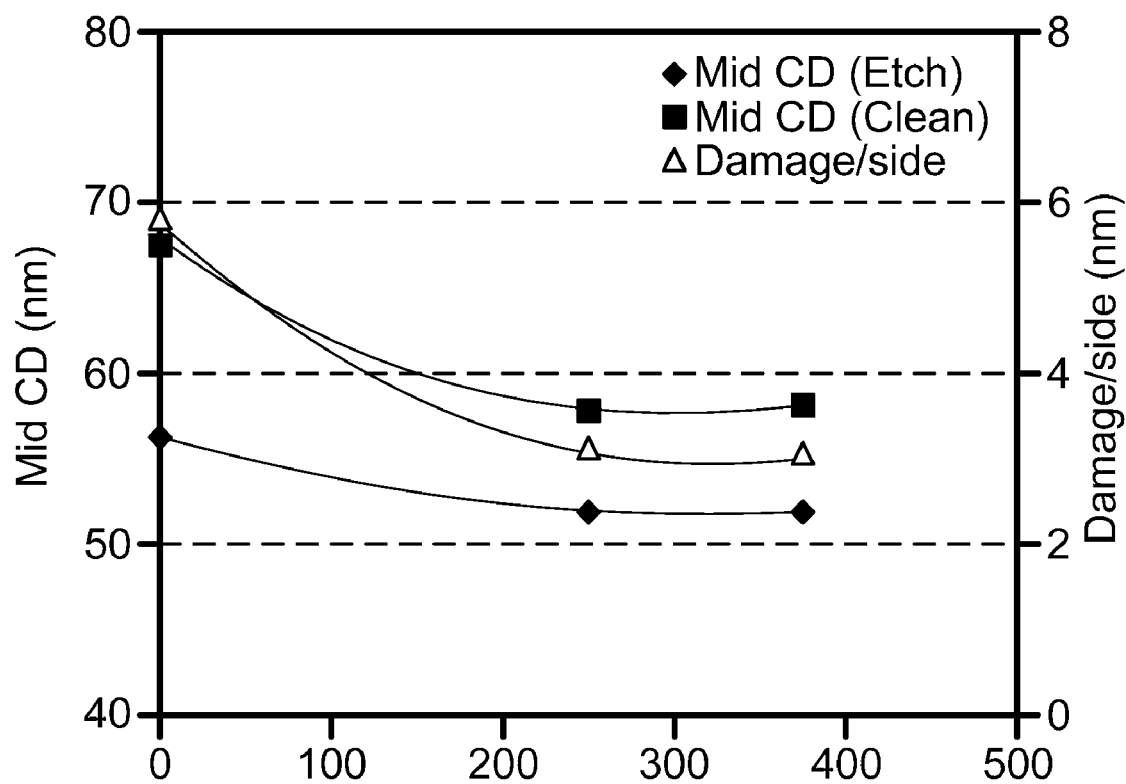
FIG. 10 provides exemplary data for removing residue from a substrate.

In FIG. 10, results are provided for the three ashing processes as the CO flow rate is varied (from 0 sccm to 375 sccm). The results include the critical dimension (CD) of the feature, i.e., via, at mid-depth following the ashing process (Mid CD (Etch): indicated as solid diamonds), the CD of the feature at mid-depth following the liner removal process (Mid CD (Clean): indicated as solid squares), and the sidewall damage following the liner removal process (Damage/side: open triangles).

As shown in FIG. 10, an increase in the CO flow rate up to about 300 sccm causes a reduction in both the mid CDs. Inspection of SEM (scanning electron microscope) cross-sections indicates that this observation may be attributed to a reduction in feature bowing. Additionally, the difference between the mid-CDs also decreases with an increase in the CO flow rate. Furthermore, the sidewall damage decreases with an increase in the CO flow rate up to about 300 sccm. Therefore, the inventors have determined that a desirable ratio of the flow rate of the $CO_2$ to the flow rate of the CO may range from about 2 to about 3. For example, the flow rate of $CO_2$ may be less than or equal to about 1000 sccm, and the flow rate of CO may be less than or equal to about 700 sccm. Additionally, for example, the flow rate of $CO_2$ may be less than or equal to about 750 sccm, and the flow rate of CO may be less than or equal to about 375 sccm.

The inventors have further determined that the above-described $CO_2$/CO-based ashing process reduces pitting on the sidewall of the via feature during the removal of the mask layer. Additionally, the inventors have further determined that the above-described $CO_2$/CO-based ashing process can maintain a critical dimension (CD) bias for the via feature of less than about 5 nanometers (nm), wherein the CD bias represents a difference between a top CD and a bottom CD for the feature and the deviation represents a change in the CD bias resulting from the removing. Additionally yet, the inventors have further determined that the above-described $CO_2$/CO-based ashing process can maintain a profile angle greater than or equal to about 85 degrees.

Figure 11:
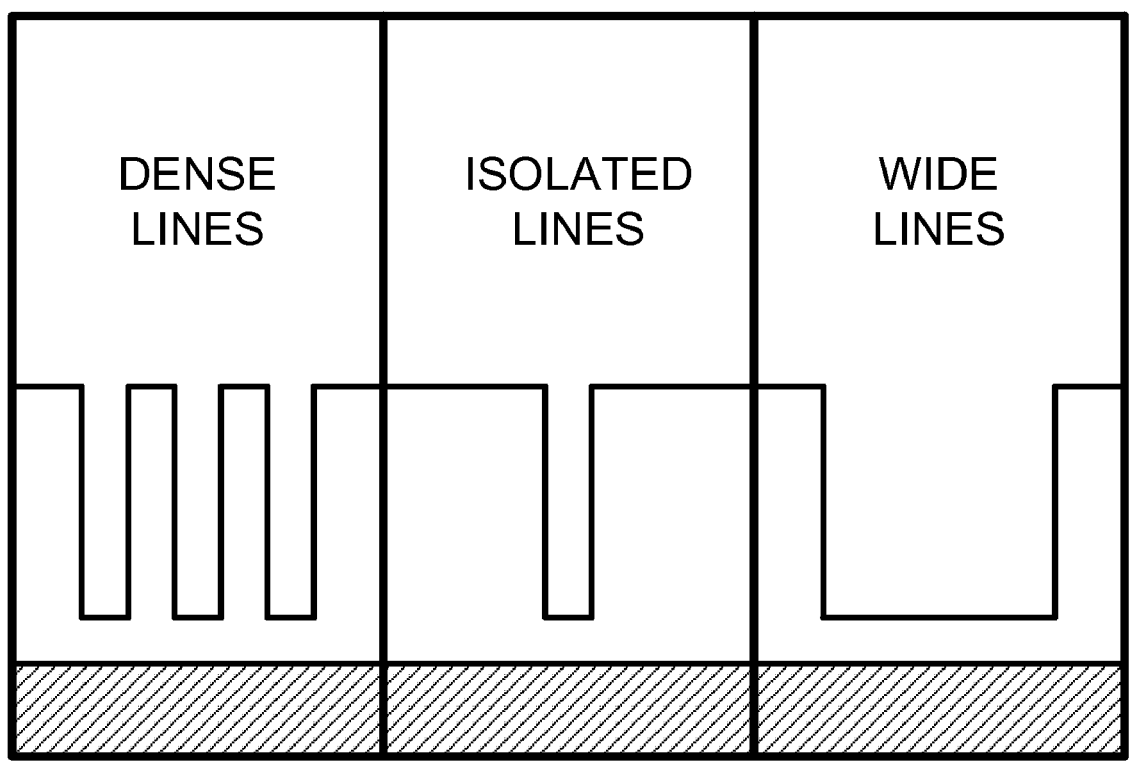
FIG. 11 illustrates several different feature patterns.

Moreover, the offset (or difference) in the CD bias for nested features (i.e., closely-spaced features, such as dense lines), isolated features (i.e., widely-spaced features, such as isolated lines), and wide features (i.e., relatively wide CD, such as wide lines) (see FIG. 11) may be maintained relative to conventional ashing processes, or reduced and/or minimized via the addition of CO.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for removing a mask layer from a substrate, comprising:
    disposing said substrate in a plasma processing system, said substrate having: a dielectric layer formed thereon, and a mask layer overlying said dielectric layer, wherein said mask layer comprises a pattern formed therein, said dielectric layer comprises a feature formed therein as a result of an etching process used to transfer said pattern in said mask layer to said dielectric layer, and said feature comprises a sidewall with a first roughness resulting from said etching process;
    introducing a process gas comprising $CO_2$ and CO into said plasma processing system;
    forming a plasma from said process gas;
    removing said mask layer from said substrate by exposing said substrate to said plasma; and
    producing a second roughness on the sidewall, wherein the second roughness is less than said first roughness by selecting a flow rate of said CO which is less than a flow rate of said $CO_2$.

2. The method of claim 1, further comprising:
    reducing pitting on said sidewall of said dielectric layer during said removing said mask layer, wherein said dielectric layer comprises a porous dielectric layer.

3. The method of claim 1, further comprising:
    maintaining a deviation in a critical dimension (CD) bias for said feature of less than about 5 nanometers (nm), wherein said CD bias represents a difference between a top CD and a bottom CD for said feature and said deviation represents a change in said CD bias resulting from said removing of said mask layer.

4. The method of claim 1, wherein a ratio of said flow rate of said $CO_2$ to said flow rate of said CO ranges from about 1.5 to about 3.

5. The method of claim 1, wherein said second roughness is less than about 5 nm.

6. The method of claim 1, wherein said second roughness is less than about 4 nm.

7. The method of claim 1, wherein said second roughness is less than about 3 nm.

8. The method of claim 1, wherein said introducing said process gas further comprises introducing a hydrocarbon gas ($C_xH_y$), wherein x and y are integers greater than or equal to unity.

9. The method of claim 1, wherein said process gas further comprises $N_2$, $H_2$, $O_2$, NO, $NO_2$, or $N_2O$, or a combination of two or more thereof.

10. The method of claim 1, wherein said process gas further comprises an inert gas.

11. The method of claim 1, further comprising:
    pre-treating said mask layer and feature to form a protective layer on said sidewall prior to said introducing said process gas comprising $CO_2$ and CO into said plasma processing system, wherein said pre-treating includes:
        introducing a pre-treatment process gas to said plasma processing system;
        forming a pre-treatment plasma from said pre-treatment process gas in said plasma processing system; and
        exposing said mask layer and said dielectric layer to said pretreatment plasma.

12. The method of claim 1, further comprising:
    introducing an additive gas into said plasma processing system; and
    terminating said introducing said additive gas prior to terminating said introducing said process gas.

13. The method of claim 1, further comprising:
    maintaining pressure of a chamber of said plasma processing system at 100 mtorr or less; and
    coupling RF power to a substrate holder in said chamber at a power level of 1000 W or less.

14. The method of claim 4, wherein said ratio ranges from about 2 to about 3.

15. The method of claim 11, wherein said pre-treatment process gas comprises one or more gases selected from the group consisting of a hydrocarbon gas, a hydrofluorocarbon gas, a fluorocarbon gas, and an inert gas.

16. The method of claim 12, wherein said additive gas comprises one or more gases selected from the group consisting of $N_2$, $H_2$, $O_2$, NO, $NO_2$, $N_2O$, a hydrocarbon gas, a hydrofluorocarbon gas, a fluorocarbon gas, and an inert gas.

17. The method of claim 13, wherein said pressure is about 80 mtorr and said power level is less than about 600 W.

18. The method of claim 13, wherein said introducing comprises flowing said $CO_2$ into said chamber at a flow rate of 1000 sccm or less and flowing said CO into said chamber at a flow rate of 700 sccm or less.

19. The method of claim 13, wherein said introducing comprises flowing said $CO_2$ into said chamber at a flow rate of 750 sccm or less and flowing said CO into said chamber at a flow rate of 375 sccm or less.

* * * * *